United States Patent
Huh et al.

(10) Patent No.: US 10,298,915 B2
(45) Date of Patent: May 21, 2019

(54) LIGHT FIELD DISPLAY DEVICE AND METHOD OF MANUFACTURING THE SAME

(71) Applicant: Samsung Display Co., Ltd., Yongin-si, Gyeonggi-do (KR)

(72) Inventors: Su-Jung Huh, Yongin-si (KR); Yeon-Mun Jeon, Hwaseong-si (KR); Joo-Woan Cho, Seongnam-si (KR)

(73) Assignee: Samsung Display Co., Ltd. (KR)

( * ) Notice: Subject to any disclaimer, the term of this patent is extended or adjusted under 35 U.S.C. 154(b) by 12 days.

(21) Appl. No.: 15/685,859

(22) Filed: Aug. 24, 2017

(65) Prior Publication Data

US 2018/0124384 A1  May 3, 2018

(30) Foreign Application Priority Data

Oct. 28, 2016  (KR) .......................... 10-2016-0142385

(51) Int. Cl.

| | |
|---|---|
| *G02B 3/00* | (2006.01) |
| *G02B 3/12* | (2006.01) |
| *G02B 3/14* | (2006.01) |
| *G02F 1/29* | (2006.01) |
| *G02B 27/22* | (2018.01) |
| *H01L 27/32* | (2006.01) |

(Continued)

(52) U.S. Cl.
CPC ......... *H04N 13/305* (2018.05); *G02B 3/0006* (2013.01); *G02B 3/12* (2013.01); *G02B 3/14* (2013.01); *G02B 27/22* (2013.01); *G02B 27/2221* (2013.01); *G02F 1/1335* (2013.01); *G02F 1/1337* (2013.01); *G02F 1/1343* (2013.01); *G02F 1/133526* (2013.01); *G02F 1/29* (2013.01); *H01L 27/32* (2013.01); *G02F 2001/133314* (2013.01)

(58) Field of Classification Search
CPC  G02B 27/2214; G02B 27/2221; G02B 27/22; H04N 13/0404; H04N 13/305; H04N 2013/0465; H04N 2013/0461; H04N 13/0445; H04N 13/0446; H04N 13/0447; G02F 1/133526; G02F 1/1337; G09G 2320/068
See application file for complete search history.

(56) References Cited

U.S. PATENT DOCUMENTS

| | | | |
|---|---|---|---|
| 2008/0036759 A1* | 2/2008 | Koike | G02B 27/22 345/419 |
| 2009/0122210 A1* | 5/2009 | Im | G02B 27/2228 349/15 |

(Continued)

*Primary Examiner* — Jia X Pan
(74) *Attorney, Agent, or Firm* — Innovation Counsel LLP

(57) ABSTRACT

A light field display device according to example embodiments includes a lower substrate, a back plane structure on the lower substrate, a first electrode electrically connected to the back plane structure, an organic light emitting layer on the first electrode, a second electrode facing the first electrode and covering the organic light emitting layer, an encapsulation layer covering the second electrode, a lower alignment layer directly on the encapsulation layer, a liquid crystal layer on the lower alignment layer, the liquid crystal layer including a plurality of micro liquid crystal lenses to constitute a microlens array, a lens electrode on the liquid crystal layer to form an electric field with the second electrode, and an upper substrate on the lens electrode.

16 Claims, 15 Drawing Sheets

(51) Int. Cl.
    *G02F 1/1333*     (2006.01)
    *G02F 1/1335*     (2006.01)
    *G02F 1/1337*     (2006.01)
    *G02F 1/1343*     (2006.01)
    *H04N 13/305*     (2018.01)

(56) References Cited

U.S. PATENT DOCUMENTS

| | | | |
|---|---|---|---|
| 2009/0190048 A1* | 7/2009 | Hong | G02B 27/2214 349/15 |
| 2011/0157499 A1* | 6/2011 | Lee | G02B 3/08 349/15 |
| 2011/0228181 A1* | 9/2011 | Jeong | G02B 5/1842 349/15 |
| 2013/0107174 A1* | 5/2013 | Yun | G02F 1/133526 349/96 |
| 2013/0135545 A1* | 5/2013 | Jung | G02F 1/13306 349/33 |
| 2013/0314649 A1* | 11/2013 | Choi | G02B 27/2214 349/96 |
| 2015/0192781 A1* | 7/2015 | Lee | G02B 27/2214 349/128 |
| 2016/0198148 A1 | 7/2016 | Asai | |
| 2016/0212414 A1 | 7/2016 | Chen | |

\* cited by examiner

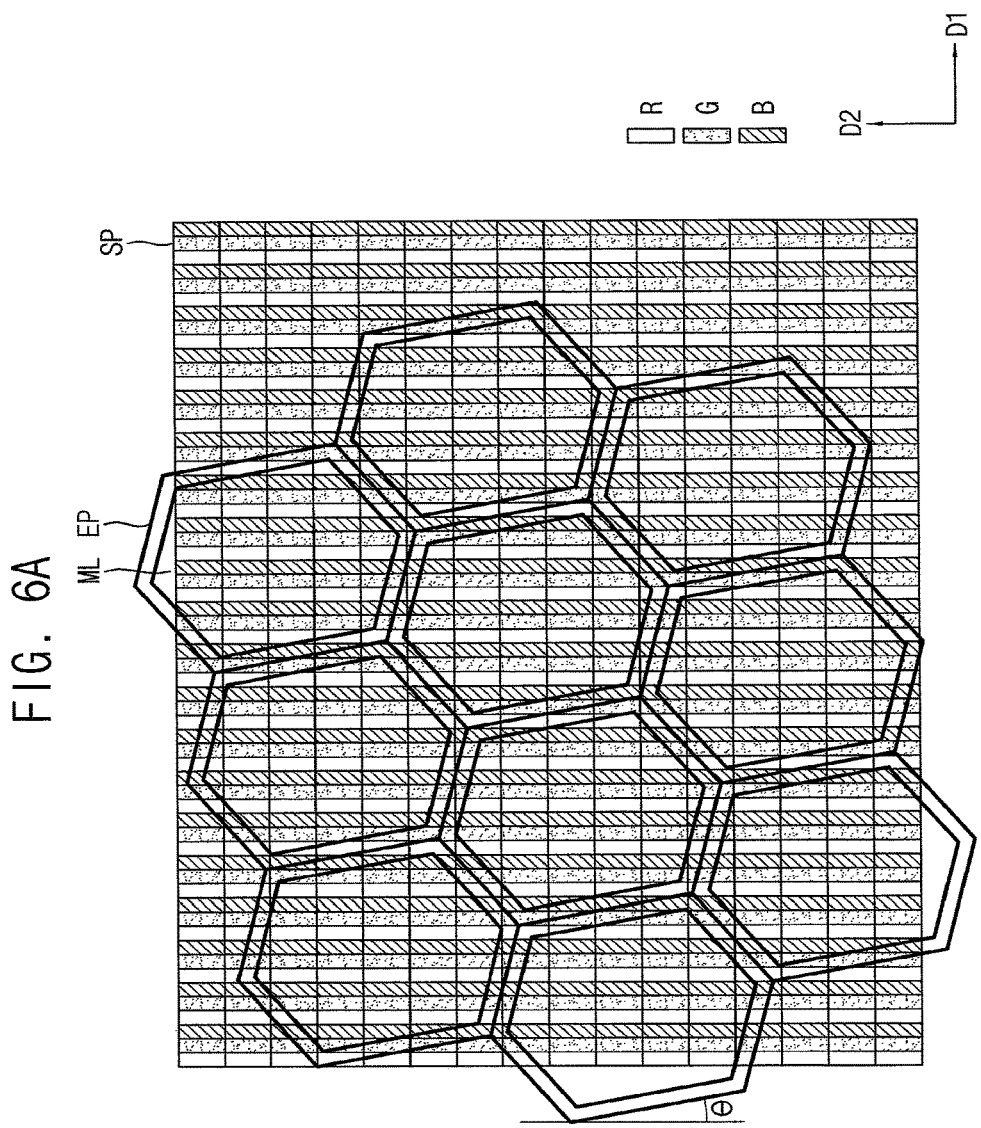

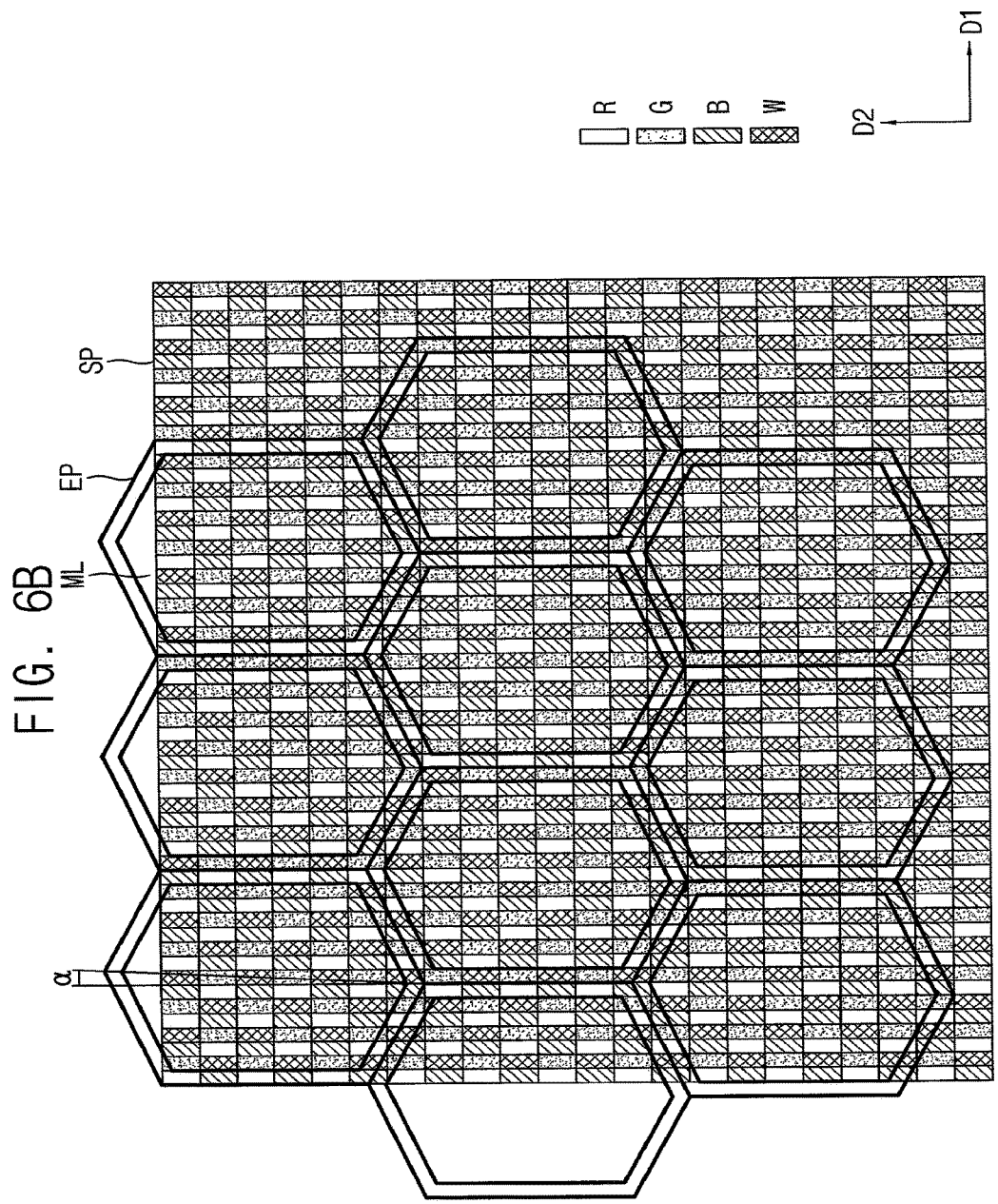

LIGHT FIELD DISPLAY DEVICE AND METHOD OF MANUFACTURING THE SAME

CROSS REFERENCE TO RELATED APPLICATION

This application claims priority to and the benefit of Korean Patent Application No. 10-2016-0142385, filed on Oct. 28, 2016 in the Korean Intellectual Property Office (KIPO), the disclosure of which is hereby incorporated by reference herein in its entirety.

BACKGROUND

1. Field

Example embodiments of the inventive concept relate to display devices. More particularly, example embodiments of the inventive concept relate to light field display devices and methods of manufacturing the same.

2. Discussion of Related Art

The stereoscopic display technology is applied to a variety of image display fields such as movies, TVs, and mobile display devices. The ultimate goal of stereoscopic image display is to enable people to experience the same three-dimensional effect as they would experience in a real environment. To do this, many kinds of techniques such as stereo methods and multi view methods have been studied. Among them, a light field method for the stereoscopic image can reproduce the three-dimensional spatial information more accurately than the stereo method or the multi view method.

Active liquid crystal lenses for implementing a lens by controlling a direction distribution of liquid crystal molecules with an electric field have been recently researched. The liquid crystal lenses include an upper substrate, a lower substrate, and a thick liquid crystal layer between the upper and lower substrates. The liquid crystal lenses include a plurality of lens electrodes. Different voltages are applied to the respective lens electrodes to control the direction distribution of liquid crystal molecules. A two dimensional (2D) image display mode and a stereoscopic image display mode may be switched by the liquid crystal control.

However, typical 2D/3D switchable display devices simply include a liquid crystal display (LCD) panel and a liquid crystal lens panel attached to the LCD panel by using an optically clear adhesive (OCA) and the liquid crystal lens panel includes the thick and rigid upper and lower substrates, the plurality of electrodes and the liquid crystal layer. Accordingly, it is difficult to reduce a thickness of the light field display device, use an organic light emitting display panel, and realize a flexible light field display device.

SUMMARY

Example embodiments provide a light field display device in which an alignment layer and/or a lens electrode are directly formed on an organic light emitting display panel.

Example embodiments provide a method of manufacturing a light field display device for integrating an alignment layer and/or a lens electrode on an organic light emitting display panel.

According to example embodiments, a light field display device may comprise a lower substrate, a back plane structure on the lower substrate, a first electrode electrically connected to the back plane structure, an organic light emitting layer on the first electrode, a second electrode facing the first electrode and covering the organic light emitting layer, an encapsulation layer covering the second electrode, a lower alignment layer directly on the encapsulation layer, a liquid crystal layer on the lower alignment layer, the liquid crystal layer including a plurality of micro liquid crystal lenses to constitute a microlens array, a lens electrode on the liquid crystal layer to form an electric field with the second electrode, and an upper substrate on the lens electrode.

In example embodiments, a voltage may be applied to the lens electrode in a stereoscopic image display mode to form the electric field between the lens electrode and the second electrode.

In example embodiments, the light field display device may further comprise an upper alignment layer between the liquid crystal layer and the lens electrode.

In example embodiments, the lens electrode may have a plurality of annular patterns, and wherein each of the micro liquid crystal lenses is surrounded by an annular pattern of the plurality of annular patterns.

In example embodiments, a planar shape of each of the micro liquid crystal lenses surrounded by the lens electrode may be circular or elliptical.

In example embodiments, the lens electrode may include a plurality of circular or elliptical openings corresponding to the micro liquid crystal lenses.

In example embodiments, a planar shape of the lens electrode is a quadrilateral shape having a plurality of circular or elliptical openings corresponding to the micro liquid crystal lenses.

In example embodiments, the lens electrode has a plurality of hexagonal openings and a planar shape of each of the micro liquid crystal lenses surrounded by the lens electrode may be substantially hexagonal.

In example embodiments, a width of each of the annular patterns may be within a range of about 3% to about 20% of a pitch of each of the micro liquid crystal lenses.

In example embodiments, the light field display device may further comprise a touch sensing unit on the upper substrate.

According to example embodiments, a light field display device may comprise an organic light emitting display panel including a lower substrate, an encapsulation layer, and a plurality of sub pixels arranged in a matrix form between the lower substrate and the encapsulation layer, a lower lens electrode directly on the encapsulation layer, a lower alignment layer directly on the encapsulation layer, a liquid crystal layer on the lower alignment layer, the liquid crystal layer including a plurality of micro liquid crystal lenses to constitute a microlens array, an upper alignment layer on the liquid crystal layer, an upper lens electrode on the liquid crystal layer to form an electric field with the lower electrode lens by receiving a voltage, and an upper substrate on the upper lens electrode.

In example embodiments, the lower lens electrode may be facing the sub pixels in common and the upper lens electrode may have a plurality of annular patterns, and wherein each of the micro liquid crystal lenses is surrounded by an annular pattern of the plurality of annular patterns.

In example embodiments, the upper lens electrode may be facing the sub pixels in common and the lower lens electrode may have a plurality of annular patterns, and wherein each of the micro liquid crystal lenses is surrounded by an annular pattern of the plurality of annular patterns.

In example embodiments, the lower lens electrode and the upper lens electrode may have annular patterns alternating with each other in a first direction in which the micro liquid crystal lenses are arranged. A part of an edge of the lower lens electrode may overlap a part of an edge of the upper lens electrode.

According to example embodiments, a method of manufacturing a light field display device may comprise forming an organic light emitting display panel in which a lower substrate, a back plane structure, a first electrode, a organic light emitting layer, a second electrode, and an encapsulation layer covering the second electrode are sequentially stacked, forming a lower alignment layer on the encapsulation layer, patterning an upper lens electrode on a lower surface of an upper substrate, the upper lens electrode forming an electric field with the second electrode, forming an upper alignment layer on the lower surface of the upper substrate to cover the upper lens electrode, forming a liquid crystal layer on the lower alignment layer or the upper alignment layer to constitute a microlens array having a plurality of micro liquid crystal lenses, and attaching the upper substrate to the encapsulation layer so that the liquid crystal layer is between the lower alignment layer and the upper alignment.

In example embodiments, forming the lower alignment layer may include directly coating a polyimide-based polymer resin on an upper surface of the encapsulation layer, and baking the coated polyimide-based polymer resin in an about 100° C. environment, followed by ultraviolet curing.

In example embodiments, the upper lens electrode may include an indium zinc oxide patterned in a room temperature environment.

In example embodiments, the upper lens electrode may have a plurality of annular patterns, and wherein each of the micro liquid crystal lenses is surrounded by an annular pattern of the plurality of annular patterns.

In example embodiments, the upper lens electrode may include a plurality of circular or elliptical openings corresponding to the micro liquid crystal lenses.

In example embodiments, forming a lower alignment layer may include depositing a lower lens electrode including an indium zinc oxide on the encapsulation layer in a room temperature environment, directly coating a polyimide-based polymer resin on an exposed portion of the encapsulation layer and the lower lens electrode, and baking the coated polyimide-based polymer resin in an about 100° C. environment, followed by ultraviolet curing.

Therefore, the light field display device according to example embodiments may have the liquid crystal lens structure including the microlens array directly integrated on the organic light emitting display panel, so that an additional substrate, an adhesive, and a lower electrode of the liquid crystal lens required for manufacturing a liquid crystal lens panel can be removed. Accordingly, the manufacturing cost of the light field display device may be reduced, and a thickness of the light field display device may be reduced. In addition, a flexible light field display device can be implemented by using a flexible organic light emitting display panel. Users can view a natural stereoscopic image of the multi-viewpoints. Further, the second electrode of the organic light emitting display panel may be used as one of the driving electrode for controlling the liquid crystal layer and only the voltage applied to the lens electrode may be controlled to display the 2D image or the stereoscopic image.

In addition, the method of manufacturing the light filed display device may form the lower alignment layer or the lower lens electrode in the relatively low temperature environment compared with the typical liquid crystal lens panel process, such that the liquid crystal lens structure including the microlens array may be directly integrated on the organic light emitting display panel. Accordingly, an additional substrate, an adhesive, and a lower electrode of the liquid crystal lens required for manufacturing the liquid crystal lens structure may be removed. Thus, the manufacturing cost of the light field display device may be reduced, and a thickness of the light field display device may be reduced.

BRIEF DESCRIPTION OF THE DRAWINGS

Example embodiments can be understood in more detail from the following description taken in conjunction with the accompanying drawings, in which:

FIGS. 6A, 6B, and 6C are diagrams illustrating examples of relations of arrangement between a microlens array and sub pixels of the light field display device of FIG. 2.

DETAILED DESCRIPTION OF EMBODIMENTS

Exemplary embodiments will be described more fully hereinafter with reference to the accompanying drawings, in which various embodiments are shown.

Figure 1A:
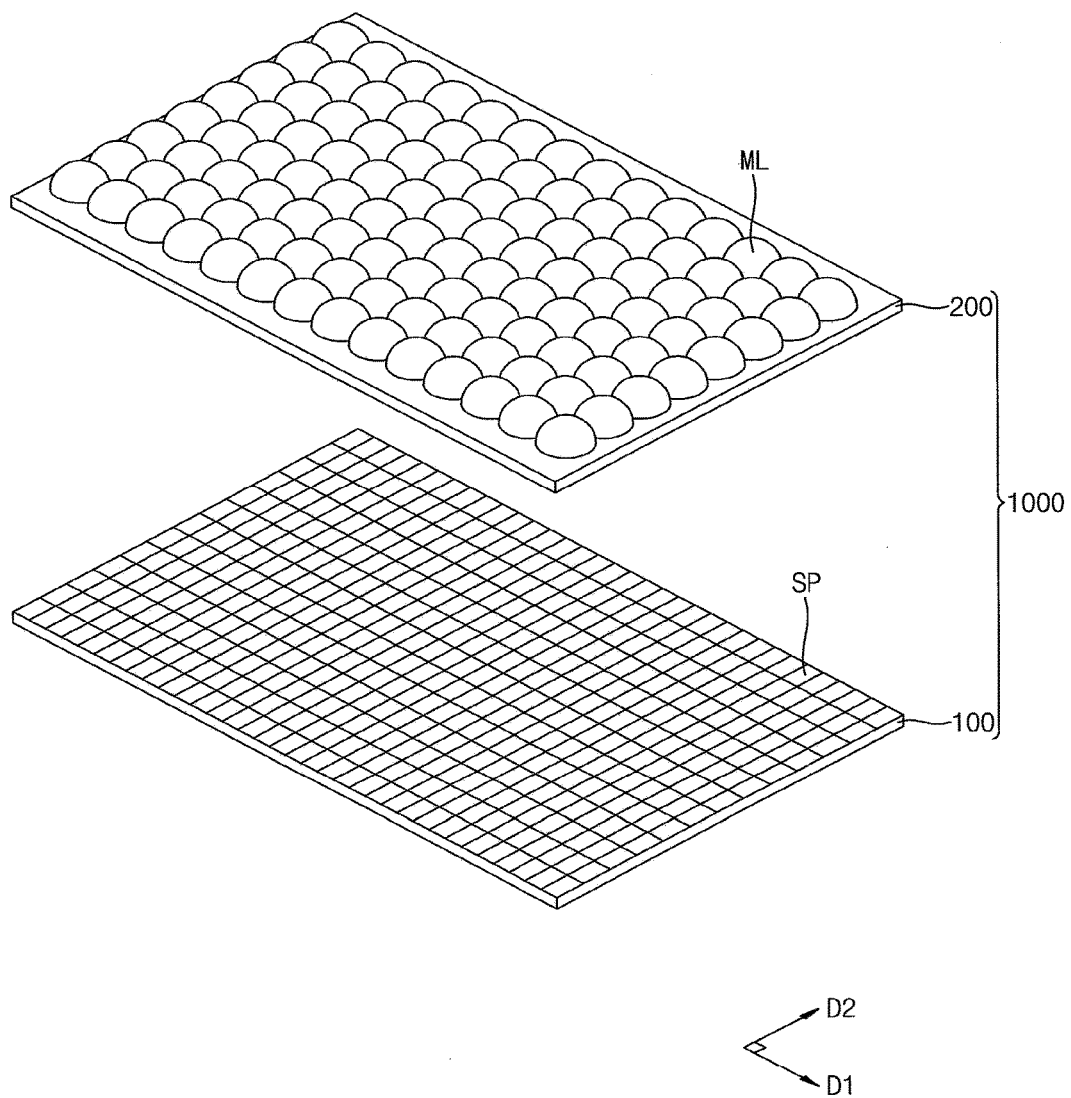
FIG. 1A is an exploded perspective view schematically illustrating a light field display device according to example embodiments.
Figure 1B:
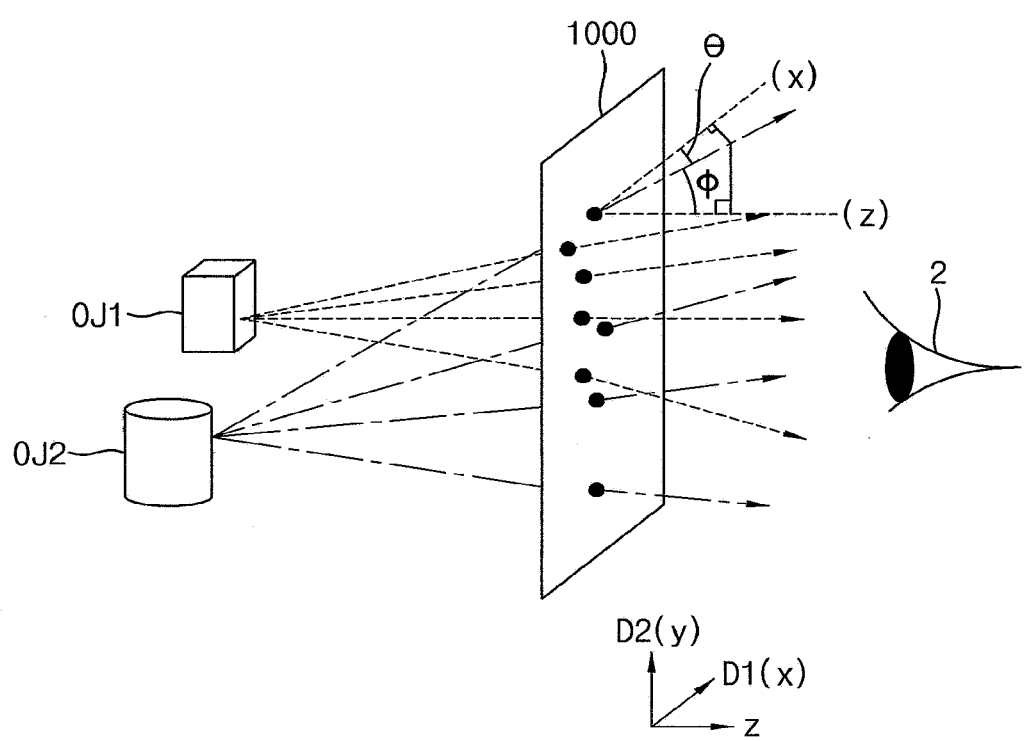
FIG. 1B is schematic view illustrating an example of a user viewing a stereoscopic image using the light field display device of FIG. 1A.

FIG. 1A is an exploded perspective view schematically illustrating a light field display device according to example embodiments. FIG. 1B is a schematic view illustrating an example of a user viewing a stereoscopic image using the light field display device of FIG. 1A.

The light field display device 1000 may include an organic light emitting display panel 100 having a plurality of organic light emitting diodes and a microlens array 200 having a plurality of micro liquid crystal lenses ML. The microlens array 200 may be integrated on the organic light emitting display panel 100.

The organic light emitting display panel 100 may include a plurality of pixels each having organic light emitting diodes. Each of the pixels may include a plurality of sub pixels SP, e.g., a red sub pixel, a green sub pixel, and a blue sub pixel. The sub pixels SP may be arranged in a matrix form in a first direction D1 and a second direction D2 substantially perpendicular to the first direction D1. Each of the sub pixels SP may include a pixel circuit (a back plane structure), a first electrode, an organic light emitting layer, and a second electrode.

The microlens array 200 may be integrated on the organic light emitting display panel 100. In some embodiments, the microlens array 200 may be integrated on an encapsulation layer (e.g., a thin film encapsulation layer). The microlens array 200 may include a plurality of microlenses ML. Lights generated on the sub pixels SP of the organic light emitting display panel 100 may be passed through the microlenses ML so as to generate a light field. Arrangements of the sub pixels SP, arrangements of the microlenses ML, and relative positional relationships between the sub pixels SP and the microlenses ML may be implemented in various embodiments to generate the light field.

The microlens array 200 may be composed of active lenses. The microlens array 200 may generate an electric field by a voltage applied to electrodes constituting the microlens array 200, thereby modifying an arrangement of liquid crystal molecules. In a two-dimensional (2D) image display mode, the microlens array 200 may allow an image displayed on the organic light emitting display panel 100 to be transmitted as it is. In a stereoscopic image display mode, the microlens array 200 may separate a field of vision of the image of the organic light emitting display panel 100. For example, in the stereoscopic image display mode, the microlens array 200 may allow multiple viewpoint images displayed on the organic light emitting display panel 100 to form an image in a corresponding view area for each of the multiple viewpoint images using diffraction and refraction of light.

As illustrated in FIG. 1B, 'Light Field' is a concept that expresses a state in which light is distributed in space through a distribution of rays. Using this concept, light reflected or generated from an object may be defined as going straight into the human eye through space, and the three-dimensional space may comprise a multitudinous of light fields. An individual light field may be mathematically represented by a five-dimensional Plenoptic function, for example. Accordingly, the light field may be represented in terms of three-dimensional spatial coordinates (x, y, z) of a point where a ray passes through a specific plane in space and luminance with respect to a spatial direction angle $(\theta,\phi)$ to which the ray is directed. The light field may be captured by informing the Plenoptic function value of the light passing through the specific plane described above. That is, the light field may be obtained by a luminance value by $(\theta, \phi)$ for each coordinates (x, y, z) of a certain region. For example, a 2D camera records the luminance by $(\theta, \phi)$ with respect to a specific point (=specific viewpoint) in space. In contrast, a light field camera for acquiring the light field may record the luminance by $(\theta, \phi)$ for all the coordinate values within a certain area.

The light field obtained by the light field camera may be displayed by the light field display device 1000 and users 2 can view the stereoscopic image with respect to objects OJ1 and OJ2. Since the light field display device 1000 may realize the light field, different stereoscopic images may be viewed as the user 2 moves. Therefore, a realistic stereoscopic image may be viewed by the light field display device 1000 as compared with the existing stereoscopic image display device of a stereo type or a multi-view type.

Figure 2:
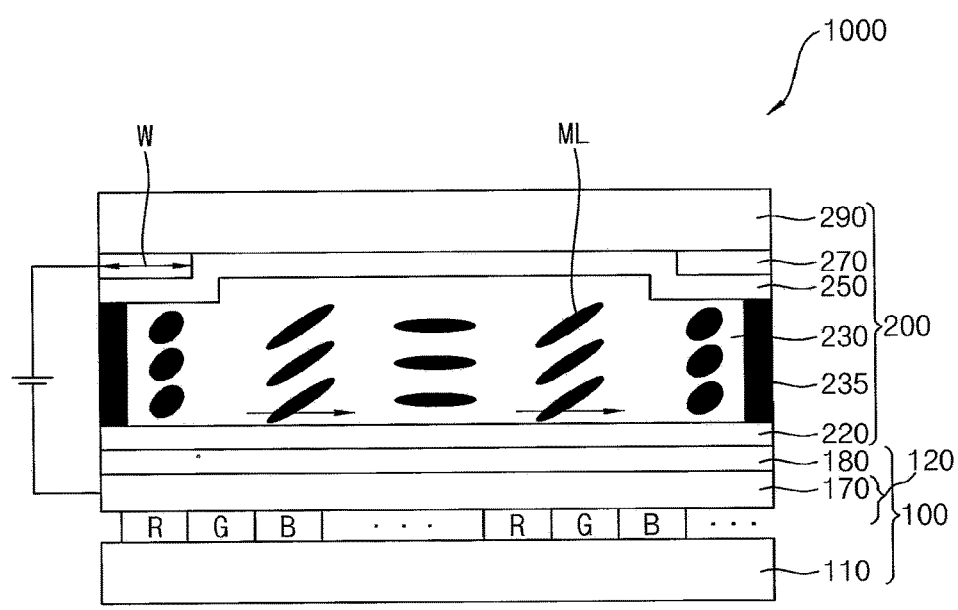
FIG. 2 is a cross-sectional view of a light field display device according to example embodiments.

FIG. 2 is a cross-sectional view of a light field display device according to example embodiments.

Referring to FIG. 2, the light field display device 1000 may include a lower substrate 110, a back plane structure, a display structure 120 having a second electrode 170, an encapsulation layer 180, a lower alignment layer 220, a liquid crystal layer 230, a lens electrode 270 (e.g., an upper lens electrode), and an upper substrate 290. The light field display device 1000 may further include an upper alignment layer 250 between the liquid crystal layer 230 and the lens electrode 270. In some embodiments, a polarizer for controlling a transmission axis direction of light may be further disposed on the upper substrate 290. The display structure 120 may include a pixel circuit, a first electrode on the pixel circuit, an organic light emitting layer on the first electrode, and the second electrode 170 on the organic light emitting layer.

The light field display device 1000 may be divided into an organic light emitting display panel 100 and a microlens array 200 integrated on an emitting surface of the organic light emitting display panel 100.

The microlens array 200 may include the lower alignment layer 220, the liquid crystal layer 230, the upper alignment layer 250, the lens electrode 270, and the upper substrate 290.

The light field display device 1000 may operate in a two-dimensional (2D) image display mode for displaying a 2D image and a stereoscopic image display mode for displaying a stereoscopic image. A direction distribution of the liquid crystal molecules in the microlens array 200 may be controlled to display the 2D image or stereoscopic image. The direction distribution of the liquid crystal molecules may be controlled by a voltage applied to driving electrodes disposed above and below the liquid crystal layer.

In the stereoscopic image display mode, the lens electrode 270 may function as an upper driving electrode of the liquid crystal layer 230 and the second electrode 170 (e.g., a cathode electrode of an organic light emitting diode) of the organic light emitting display panel 100 may function as a lower driving electrode to drive the liquid crystal layer 230. Thus, alignment directions of the liquid crystal molecules included in the liquid crystal layer 230 may be appropriately adjusted by an electric field formed between the lens electrode 270 and the second electrode 170.

A driving voltage, e.g., ELVSS may be applied to the second electrode 170 to emit light regardless of the display mode.

In the 2D image display mode, the voltage may be not applied to the lens electrode 270 so that the electric field may be not generated in the liquid crystal layer 230 (i.e., between the second electrode 170 and the lens electrode 270). Thus, the image output from sub pixels R, G, and B may penetrate the liquid crystal layer 230 as it is.

The lower substrate 110 may serve as a back-plane substrate or a based substrate of the light field display device 1000. The lower substrate 110 may be a polymer substrate. The lower substrate may be provided as a transparent insulation substrate. For example, the lower substrate 110 may include polymer materials having transparency and flexibility.

The pixel circuit, the first electrode electrically connected to the pixel circuit, the organic light emitting layer on the first electrode, the second electrode 170 facing the first electrode and covering the organic light emitting layer may all be disposed on the lower substrate 110 in order. In some embodiments, the first electrode may be provided as anode electrodes of the sub pixels R, G, and B, and the second electrode 170 may be provided as cathode electrodes of the sub pixels R, G, and B.

The second electrode 170 may be provided as a common electrode for the plurality of sub pixels R, G, and B. The second electrode 170 may include a metal having a low work function such as aluminum Al, silver Ag, tungsten (W), copper (Cu), nickel (Ni), chrome (Cr), molybdenum (Mo), titanium (Ti), platinum (Pt), tantalum (Ta), neodymium (Nd), scandium (Sc), or an alloy of the metals.

The encapsulation layer 180 (thin film encapsulation layer) for protecting the display structure 120 may be disposed on the second electrode 170. The encapsulation layer 180 may be a thin film encapsulation layer. The encapsulation layer 180 may include inorganic materials such as silicon nitride, and/or metal oxide, etc. In some embodiments, the encapsulation layer 180 may have a form comprising a plurality of layers in which an organic layer (or organic layers) is disposed between inorganic layers for planarization. Accordingly, an upper surface of the encapsulation layer 180 may flat. However, the encapsulation layer 180 is not limited thereto, and the encapsulation layer 180 may be replaced by a rigid glass substrate.

The lower alignment layer 220 may be directly disposed on the encapsulation layer 180. In some embodiments, the lower alignment layer 220 may include a polyimide-based polymer resin. The lower alignment layer 220 may determine an initial orientation of the liquid crystal molecules included in the liquid crystal layer 230 and determine alignment directions of the liquid crystal molecules in advance.

The lower alignment layer 220 may be directly formed on encapsulation layer 180 by a low-temperature firing process. The lower alignment layer 220 may be formed in about 100° C. environment to prevent deformation of the back-plane structure and the display structure 120. Thus, an optically clear adhesive and/or an optical bonding process are not required.

In some embodiments, the viscosity of the polyimide-based polymer resin may be about 1.7 cP (centi-poise) to about 3 cP. In some embodiments, the coated polyimide-based polymer resin on the encapsulation layer 180 may be dried for about 1 minute in about 100° C. environment and then may be cured by ultraviolet rays having a wavelength about 300 nm to about 320 nm (preferably 313 nm) and an energy of about 20 mW/cm2, such that the lower alignment layer 220 may be formed. Since the lower alignment layer 220 may be directly formed on the encapsulation layer 180 of the organic light emitting display panel 100 in a relatively low temperature environment, the display structure 120 may be not deformed by the lower alignment layer 220 forming process.

The liquid crystal layer 230 including a plurality of micro liquid crystal lenses ML for constituting the microlens array may be disposed on the lower alignment layer 220. In some embodiments, a planar shape of each of the micro liquid crystal lenses may have at least one of circular shape, elliptical shape, and hexagonal shape. The number of viewpoints for covering output light from the sub pixels R, G, and B may be determined based on pitches of each of the micro liquid crystal lenses (e.g., a horizontal pitch and a vertical pitch) and a pitch of the sub pixels R, G, and B. For example, every micro liquid crystal lens may cover 12 horizontal viewpoints and 7 vertical viewpoints. Accordingly, the stereoscopic image of multi-viewpoints may be implemented. This will be described with reference to FIGS. 6A to 6C.

The number of horizontal viewpoints of the micro liquid crystal lens ML may be the number of sub pixels R, G, and B in a horizontal direction (e.g., direction D1 of FIG. 1) corresponding to the horizontal pitch of the micro liquid crystal lens ML. The number of vertical viewpoints of the micro liquid crystal lens ML may be the number of sub pixels R, G, and B in a vertical direction (e.g., direction D2 of FIG. 1) substantially perpendicular to the horizontal direction corresponding to the vertical pitch of the micro liquid crystal lens ML.

The liquid crystal layer 230 may be formed by injecting or dropping the liquid crystal between the lower alignment layer 220 and the upper alignment layer 250.

In some embodiments, the micro liquid crystal lens ML may be controlled based on a gap control lens method using a distance difference between driving electrodes, a voltage control lens (VCL) method using a voltage difference between the driving electrodes, Fresnel lens method, or the like.

The upper alignment layer 250 may be disposed between the liquid crystal layer 230 and the lens electrode 270. In some embodiments, the upper alignment layer 250 may include the polyimide-based polymer resin. The upper alignment layer 250 may determine the initial orientation of the liquid crystal molecules included in the liquid crystal layer 230 and determine the alignment directions of the liquid crystal molecules in advance.

The lens electrode 270 may be disposed on the liquid crystal layer 230 and the upper alignment layer 250. The lens electrode 270 may generate the electric field with the second electrode 170 in the stereoscopic image display mode. The lens electrode 270 may have annular patterns surrounding each of the micro liquid crystal lenses ML. The lens electrode 270 may have a plurality of openings corresponding to the micro liquid crystal lenses ML. In some embodiments, an outer shape of a planar shape of each of the annular patterns of the lens electrode 270 may be substantially hexagonal. In some embodiments, the outer shape of the planar shape of each of the annular patterns may be substantially tetragonal. In some embodiments, the outer shape of the planar shape of each of the annular patterns may be substantially circular. Since these are examples, shapes of the annular patterns are not limited thereto.

The lens electrode 270 may include indium zinc oxide (IZO), indium tin oxide (ITO), and the like.

Figure 3A:
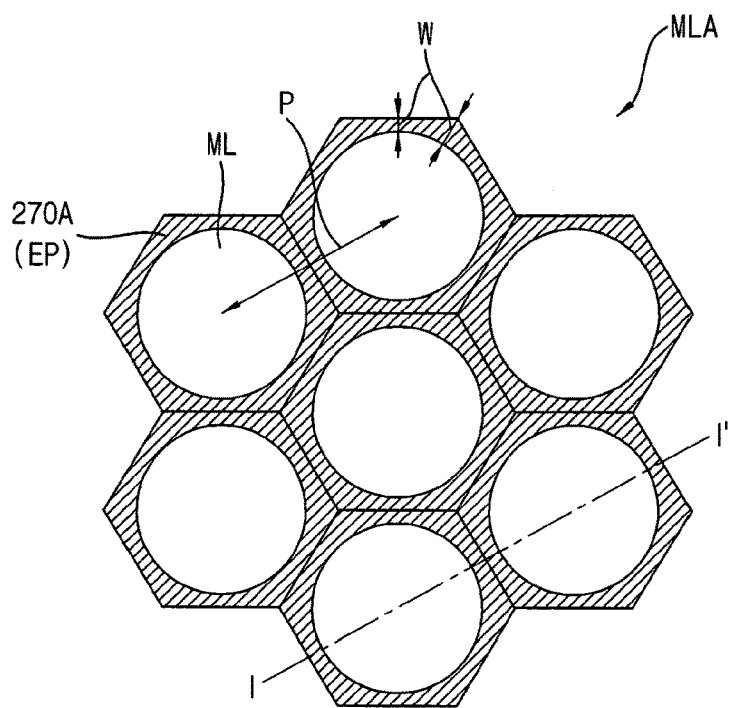
FIG. 3A is a plan view illustrating an example of a microlens array and a lens electrode included in the light field display device of FIG. 2.

In some embodiments, a width W of each of the annular patterns may be within a range of about 3% to about 20% of a pitch of each of the micro liquid crystal lenses, and the width W of each of the annular patterns may simultaneously include different percentages within this range, i.e. the width W may vary within a single annular pattern, for example as illustrated in FIG. 3A. Accordingly, unexpected refraction and diffraction of the light due to the arrangement of the lens electrode 270 can be prevented.

The upper substrate 290 may be disposed on the lens electrode 270.

In some embodiments, the light field display device 1000 may further include a touch sensing unit on the upper substrate 290.

As described above, the light field display device 1000 according to example embodiments may have the liquid crystal lens structure including the microlens array 200 directly integrated on the organic light emitting display panel 100, so that an additional substrate and a lower electrode of the liquid crystal lens required for manufacturing a liquid crystal lens panel can be removed. Accordingly, the manufacturing cost of the light field display device 1000 may be reduced, and a thickness of the light field display device 1000 may be reduced. In addition, a flexible light field display device using a flexible organic light emitting display panel can be implemented. Users can view a natural stereoscopic image of the multi-viewpoints. Further, the second electrode 170 of the organic light emitting display panel 100 may be used as one of the driving electrode for controlling the liquid crystal layer 230 and only the voltage applied to the lens electrode 270 may be controlled to display the 2D image or the stereoscopic image.

Figure 3B:
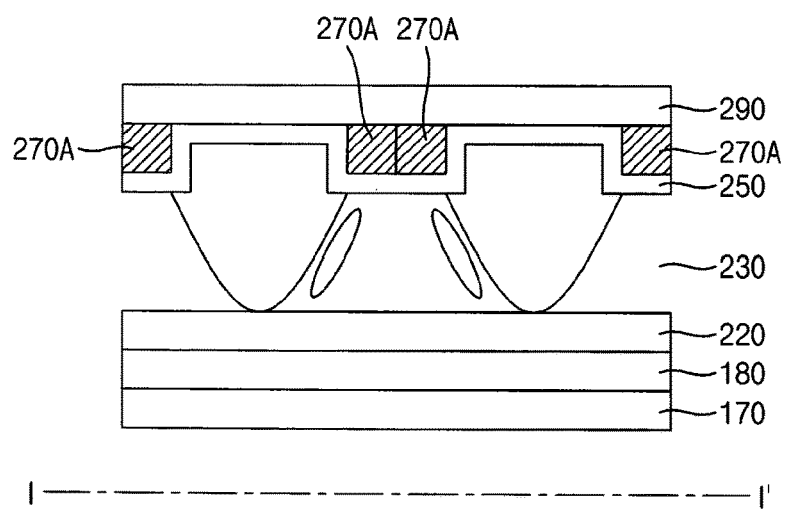
FIG. 3B is a cross-sectional view schematically illustrating an example of a portion taken along a line I-I' of FIG. 3A.

FIG. 3A is a plan view illustrating an example of a microlens array and a lens electrode included in the light field display device of FIG. 2. FIG. 3B is a cross-sectional view schematically illustrating an example of a portion taken along a line I-I' of FIG. 3A.

Referring to FIGS. 2 to 3B, the microlens array MLA may include a plurality of micro liquid crystal lenses ML.

In some embodiments, a planar shape of the micro liquid crystal lens ML may be circular or elliptical. The micro liquid crystal lenses may be arranged apart from each other by patterns (e.g. annular patterns) of the lens electrode 270A (e.g., an upper lens electrode of the microlens array). However, this is an example, and the arrangement of the micro liquid crystal lenses is not limited thereto. In the circular or elliptical shape of the micro liquid crystal lenses, a portion of any one of two adjacent micro liquid crystal lenses may be recessed so as to maximize a fill factor of the micro liquid crystal lens ML. For example, some of edges of the circular or elliptical shape of the micro liquid crystal lens ML may be recessed. The fill factor may be a ratio of actual area of the micro liquid crystal lenses in a plane on which the micro liquid crystal lenses are formed.

The lens electrode 270A may include a plurality of openings corresponding to the micro liquid lenses ML. The openings may be circular or elliptical openings. In some embodiments, the lens electrode 270A may have annular patterns EP surrounding each of the micro liquid crystal lenses. Each of the openings may be defined as the annular pattern EP. For convenience of explanation, the lens electrode 270A will be described as a set of a plurality of annular patterns EP. That is, as illustrated in FIGS. 3A to 6C, the annual patterns EP may be divided into a solid line (virtual solid line). For example, the solid line may be a border line between adjacent annular patterns EP. For example, each annular pattern EP may be a hexagonal annular shape. For example, as illustrated in FIG. 3A, an inner shape (e.g., an inner border line) of a planar shape of each of the annular patterns EP may be circular or elliptical shape corresponding to the micro liquid crystal lens ML and an outer shape (e.g., an outer border line) of the planar shape of each of the annular patterns EP may be substantially hexagonal. In other words, the lens electrode 270A may include a plurality of circular or elliptical openings corresponding to the micro liquid lenses ML. The annular patterns EP of the lens electrode 270 may be formed in a single process.

The light generated from a sub pixel corresponding to a portion where the micro liquid crystal lens ML is not formed may interfere with a generation of desired light fields for displaying stereoscopic image (e.g., crosstalk is generated).

Thus, it is preferable that the portion where the micro liquid crystal lens ML is not formed is minimized. In some embodiments, a width W of the annular pattern EP may be within a range of about 3% to about 20% of a pitch P of the micro liquid crystal lens ML. For example, when the pitch P of the micro liquid crystal lens ML is about 500 um, the width W of the annular patterns EP may be within about 2 micrometers(um) to about 10 um. When the pitch P of the micro liquid crystal lens ML is about 55 um, the width W of the annular patterns EP may be within about 1 um to about 5 um. Here, the pitch P of the micro liquid crystal lens ML may be a distance between centers of the neighboring micro liquid crystal lenses.

In some embodiments, the pitches of the micro liquid crystal lenses included in the microlens array MLA may be substantially the same each other.

As illustrated in FIG. 3B, an encapsulation layer 180 may be disposed on a second electrode 170 of an organic light emitting display device (e.g., a cathode electrode) and a lower alignment layer 220 may be disposed on the encapsulation layer 180. Further, a liquid crystal layer 230 including the micro lenses may be disposed between an upper substrate 290 at which the lens electrode 270A and an upper alignment layer 250 are disposed and the lower alignment layer 220.

In a stereoscopic image display mode, liquid crystal molecules may be rearranged by an electrical field between the lens electrode 270A having the annular patterns EP and the second electrode 170 (the cathode electrode of the organic light emitting display panel) and the light field may be generated.

Figure 4:
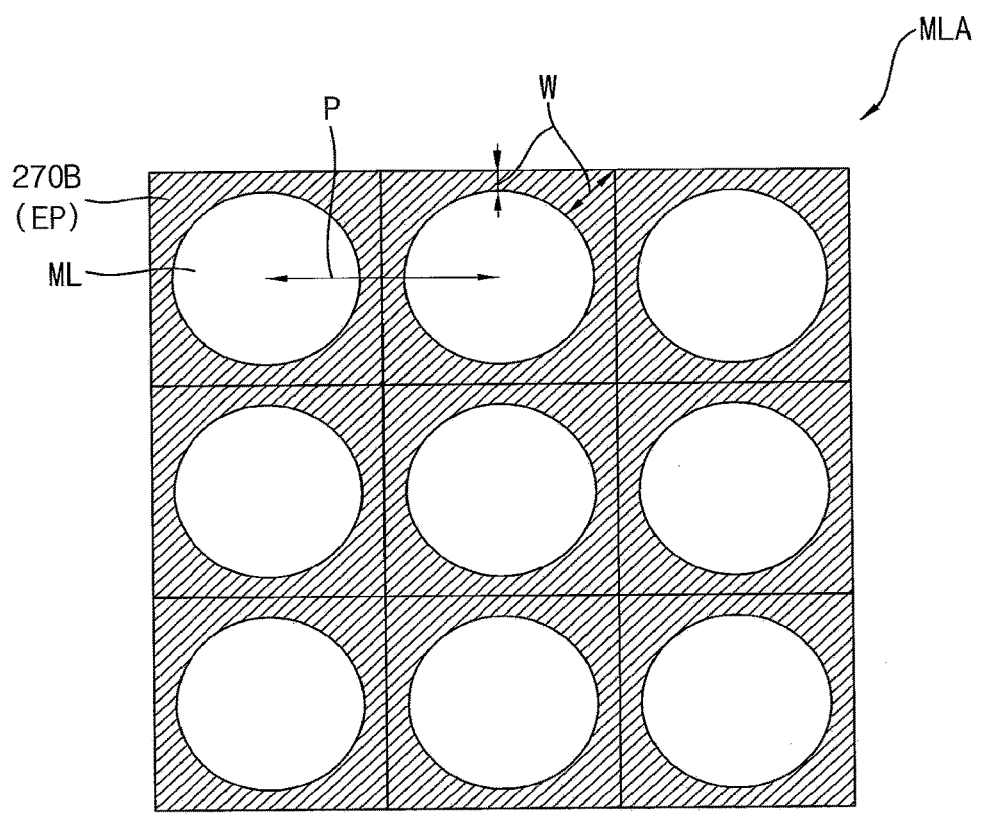
FIG. 4 is a plan view illustrating another example of a microlens array and a lens electrode included in the light field display device of FIG. 2.

FIG. 4 is a plan view illustrating another example of a microlens array and a lens electrode included in the light field display device of FIG. 2.

The light field display device of the present example embodiments is substantially the same as the light field display device explained with reference to FIG. 3A except for shapes of the lens electrode. Thus, the same reference numerals will be used to refer to the same or like parts as those described in the example embodiments of FIG. 3A, and any repetitive explanation concerning the above elements will be omitted.

Referring to FIG. 4, the microlens array MLA may include a plurality of micro liquid crystal lenses ML.

In some embodiments, a planar shape of the micro liquid crystal lens ML surrounded by the lens electrode 270B may be circular or elliptical. The micro liquid crystal lenses may be arranged apart from each other by patterns (e.g. annular patterns) of the lens electrode 270B.

In some embodiments, the lens electrode 270B may have annular patterns EP surrounding each of the micro liquid crystal lenses ML. The lens electrode 270B may have a plurality of circular or elliptical openings corresponding to the micro liquid crystal lenses ML. For example, an inner shape (e.g., an inner border line) of a planar shape of each of the annular patterns EP may be circular or elliptical shape corresponding to the micro liquid crystal lens ML and an outer shape (e.g., an outer border line) of the planar shape of each of the annular patterns EP may be substantially quadrilateral. A width W of the annular pattern EP ay be within a range of about 3% to about 20% of a pitch P of the micro liquid crystal lens ML.

In a stereoscopic image display mode, liquid crystal molecules may be rearranged by an electrical field between the lens electrode 270B having the annular patterns EP and the second electrode (the cathode electrode of the organic light emitting display panel) and the light field may be generated.

Figure 5:
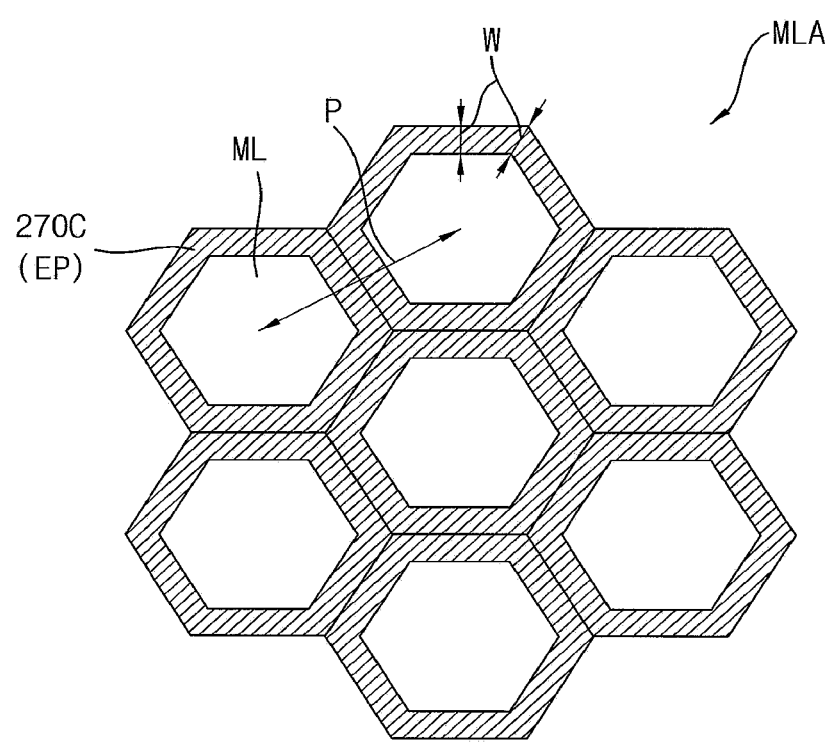
FIG. 5 is a plan view illustrating still another example of a microlens array and a lens electrode included in the light field display device of FIG. 2.

FIG. 5 is a plan view illustrating still another example of a microlens array and a lens electrode included in the light field display device of FIG. 2.

The light field display device of the present example embodiments is substantially the same as the light field display device explained with reference to FIG. 3A except for shapes of the lens electrode and the micro liquid crystal lens. Thus, the same reference numerals will be used to refer to the same or like parts as those described in the example embodiments of FIG. 3A, and any repetitive explanation concerning the above elements will be omitted.

Referring to FIG. 5, the microlens array MLA may include a plurality of micro liquid crystal lenses ML.

In some embodiments, a planar shape of the micro liquid crystal lens ML surrounded by the lens electrode 270C may be substantially hexagonal. The micro liquid crystal lenses may be arranged apart from each other by patterns (e.g. annular patterns) of the lens electrode 270C.

In some embodiments, the lens electrode 270C may have annular patterns EP surrounding each of the micro liquid crystal lenses. That is, the lens electrode 270C may have a plurality of hexagonal shape openings corresponding to the micro liquid crystal lenses. For example, an inner shape of a planar shape of each of the annular patterns EP may be hexagonal shape corresponding to the micro liquid crystal lens ML and an outer shape of the planar shape of each of the annular patterns EP may be also substantially hexagonal. A width W of the annular pattern EP may be within a range of about 3% to about 20% of a pitch P of the micro liquid crystal lens ML.

In a stereoscopic image display mode, liquid crystal molecules may be rearranged by an electrical field between the lens electrode 270C having the annular patterns EP and the second electrode (the cathode electrode of the organic light emitting display panel) and the light field may be generated.

Figure 6C:
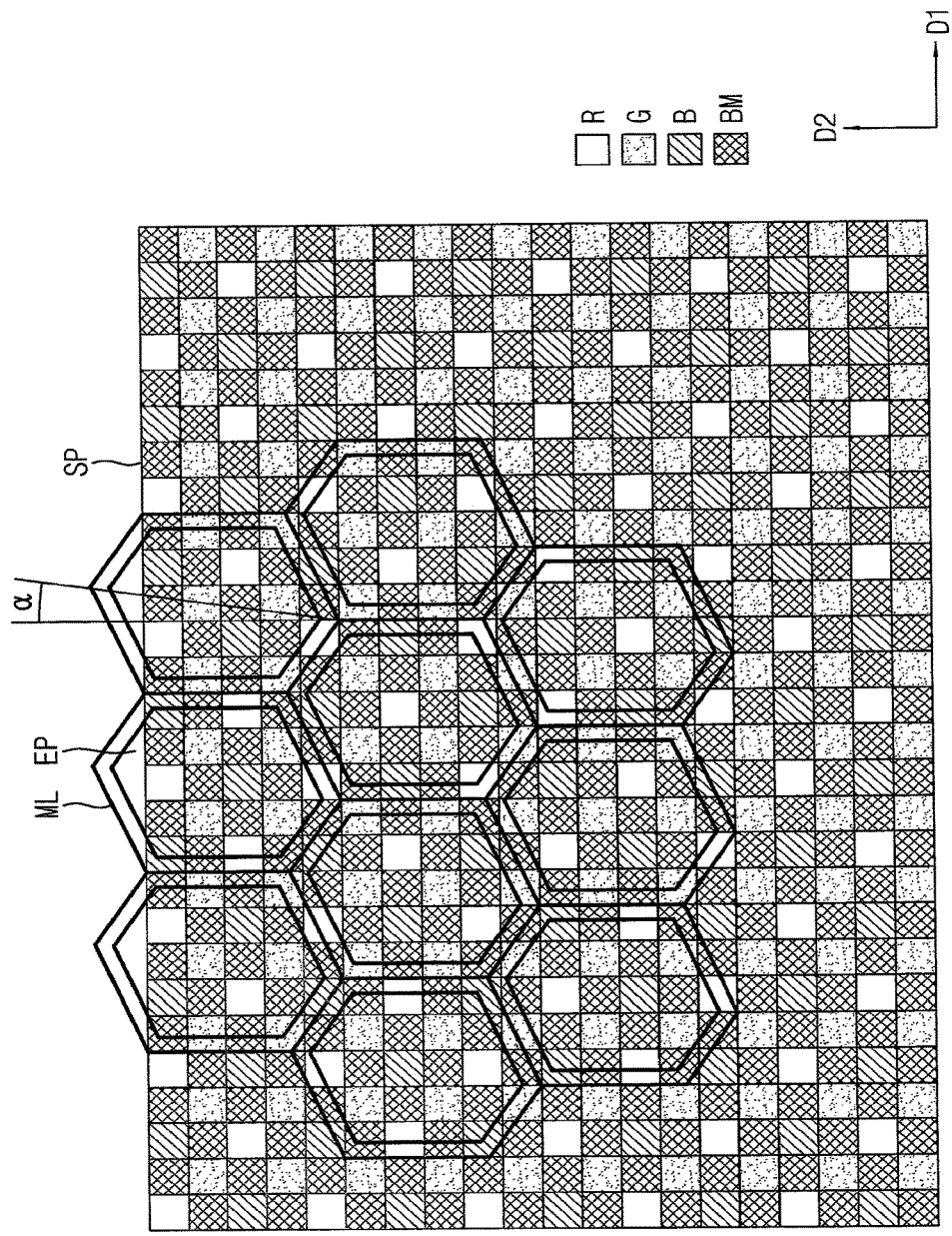

FIG. 6A to 6C are diagrams illustrating examples of relations of arrangement between a microlens array and sub pixels of the light field display device of FIG. 2.

Referring to FIGS. 6A to 6C, the light field display device may include an organic light emitting display panel having a plurality of sub pixels SP and a microlens array having a plurality of micro liquid crystal lenses ML each surrounded by a pattern (or an annular pattern) EP of a lens electrode.

The sub pixels SP may be arranged in a matrix form in a first direction D1 and a second direction D2 substantially perpendicular to the first direction D1. Although lines are shown in FIGS. 6A to 6C, a black matrix for blocking light may be formed between adjacent sub pixels SP.

The sub pixels SP may include a red sub pixel R emitting red color light, a green sub pixel G emitting green color light, and a blue sub pixel B emitting blue color light (i.e., RGB pixel structure). In some embodiments, the red sub pixel R, the green sub pixel G, and the blue sub pixel B may be repeatedly arranged along the first direction D1. The red sub pixels R, the green sub pixels G, and the blue sub pixels B may be successively arranged along the second direction D2, respectively. Thus, the sub pixels R, the green sub pixels G, and the blue sub pixels B may be arranged in a stripe form.

The planar shape of the micro liquid crystal lens ML may be hexagonal. In some embodiments, lengths of two sides facing each other may be longer than lengths of the other four sides and the hexagonal shape may be symmetrical. In some embodiments, the hexagonal shape may be regular hexagonal. In some embodiments, lengths of two sides facing each other may be shorter than lengths of the other four sides and the hexagonal shape may be symmetrical, for example the hexagonal shape may have reflectional symmetry. In some embodiments, lengths of two sides facing each other may be the same and the hexagonal shape may be asymmetrical.

Adjacent sides of each annular pattern EP of the lens electrode surrounding the micro liquid crystal lenses ML may be arranged to be contact with each other to form a honeycomb structure.

Each micro liquid crystal lens ML may be tilted at a predetermined tilt angle θ with respect to the first and second directions D1 and D2. In some embodiments, the tilt angle θ may be determined based on a pitch of the sub pixel SP in the first direction D1, a pitch of the sub pixel SP in the second direction D2, and the number of horizontal viewpoints of the micro liquid crystal lens ML.

The number of horizontal viewpoints of the micro liquid crystal lens ML may be the number of sub pixels SP in the first direction corresponding to the horizontal pitch of the micro liquid crystal lens ML (e.g., a pitch in the first direction D1). The number of vertical viewpoints of the micro liquid crystal lens ML may be the number of sub pixels SP in the second direction corresponding to the vertical pitch of the micro liquid crystal lens ML (e.g., a pitch in the second direction D2).

The horizontal pitch of the micro liquid crystal lens ML may be a distance between centers of the neighboring micro liquid crystal lenses in the first direction D1. The vertical pitch of the micro liquid crystal lens ML may be a distance between centers of the neighboring micro liquid crystal lenses in the second direction D2.

The number of horizontal viewpoints may be determined based on the number of sub pixels constituting one unit pixel. The number of vertical viewpoints may be determined based on the horizontal and vertical pitches of one sub pixel SP and the number of sub pixels constituting one unit pixel.

Accordingly, the light field display device may output the stereoscopic image of multi viewpoints (e.g., the number of viewpoints of 105 by the number of horizontal viewpoints 15 and the number of vertical viewpoints 7) reflecting the horizontal and vertical viewpoints. Users may view a natural stereoscopic image in which a specific color is not emphasized.

As illustrated in FIG. 6B, the sub pixels SP may be arranged in a matrix form in a first direction D1 and a second direction D2 substantially perpendicular to the first direction D1. The sub pixels SP may include a red sub pixel R, a green sub pixel G, a blue sub pixel B, and a white sub pixel W (i.e., RGBW pixel structure). The red, green, blue, and white sub pixels R, G, B, and W may be arranged in a tile form.

The planar shape of the micro liquid crystal lens ML may be hexagonal. In some embodiments, lengths of two sides facing each other may be the same. Left and right sides of the hexagon may be substantially parallel to the second direction D2 and a line connecting upper and lower vertexes may be inclined at a predetermined angle α with respect to the second direction D2. Thus, the micro liquid crystal lens ML may have an asymmetric hexagonal shape. For example, the predetermined angle α may be determined such that a distance between the upper vertex and the lower vertex of one micro liquid crystal lens ML in the first direction D1 is less than or equal to the horizontal pitch (a pitch in the first direction D1) of one sub pixel SP. For example, the number of horizontal viewpoints of the micro liquid crystal lens ML may be 15 and the number of vertical viewpoints of the micro liquid crystal lens ML may be 7.

As illustrated in FIG. 6C, the sub pixels SP may include a red sub pixel R, a green sub pixel G, and a blue sub pixel B. In an N-th pixel row, the red sub pixel R, the blue sub pixel B, and a black matrix BM may be repeatedly arranged along the first direction D1, where N is a positive integer. In an (N+1)-th pixel row, the black matrix BM and the green sub pixel G may be repeatedly arranged along the first direction D1 (i.e., RGBG pentile pixel structure).

The planar shape of the micro liquid crystal lens ML may be hexagonal. In some embodiments, lengths of two sides facing each other may be the same. Left and right sides of the hexagon may be substantially parallel to the second direction D2 and a line connecting upper and lower vertexes may be inclined at a predetermined angle α with respect to the second direction D2. Thus, the micro liquid crystal lens ML may have an asymmetric hexagonal shape. For example, the predetermined angle α may be determined such that a distance between the upper vertex and the lower vertex of one micro liquid crystal lens ML in the first direction D1 is less than or equal to the horizontal pitch (a pitch in the first direction D1) of one sub pixel SP.

Figure 7:
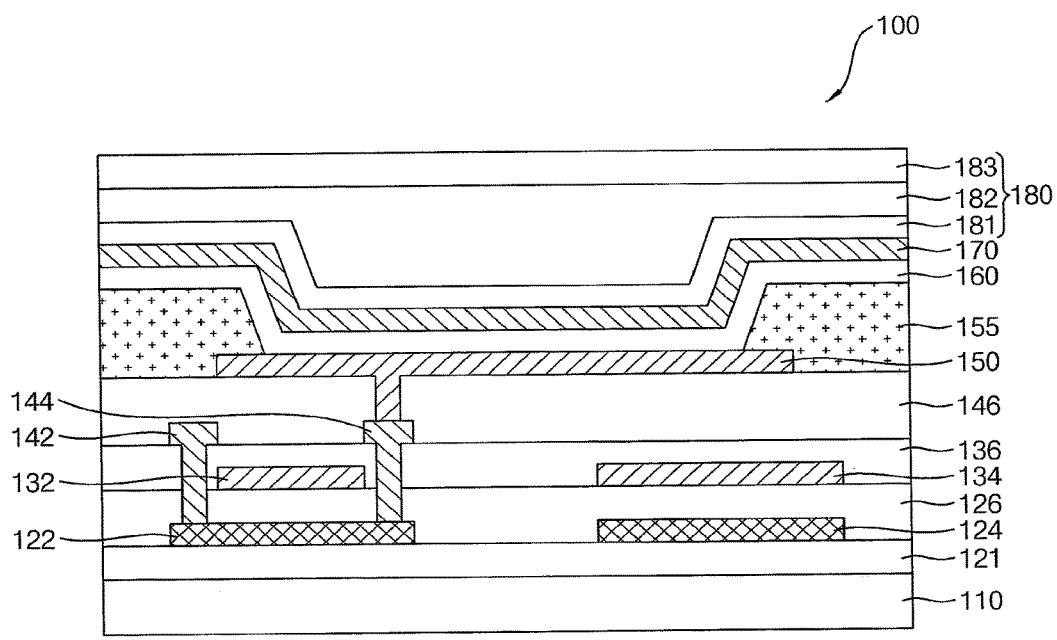
FIG. 7 is a cross-sectional view illustrating an example of an organic light emitting display panel included in the light field display device of FIG. 2.

FIG. 7 is a cross-sectional view illustrating an example of an organic light emitting display panel included in the light field display device of FIG. 2.

Referring to FIG. 7, the organic light emitting display panel 100 may include a lower substrate 110, a back plane structure on the lower substrate, and a display structure on the back plane structure.

A transparent insulation substrate may be used as the lower substrate 110.

A buffer layer 121 may be disposed on the lower substrate 110. The buffer layer 121 may have a multi-stacked structure including a silicon oxide layer and a silicon nitride layer. Active patterns 122 and 124 may be disposed on the barrier layer 120. A gate insulation layer 126 may be disposed on the buffer layer 121 to cover the active patterns 122 and 124. The gate insulation layer 126 may include silicon oxide or silicon nitride. Gate electrodes 132 and 134 may be disposed on the gate insulation layer 126. An insulating interlayer 136 may be disposed on the gate insulation layer 126 to cover the gate electrodes 132 and 134. The insulating interlayer 136 may include silicon oxide or silicon nitride, for example. A source electrode 142 and a drain electrode 144 may extend through the insulating interlayer 136 and the gate insulation layer 126 to be in contact with a first active pattern 122.

A thin film transistor (TFT) may be defined by the first active pattern 122, the gate insulation layer 126, the first gate electrode 132, the source electrode 142 and the drain electrode 144. Additionally, a capacitor may be defined by a second active pattern 124, the gate insulation layer 126, and the second gate electrode 134.

A via-insulation layer 146 may be disposed on the insulating interlayer 136 to cover the source and drain electrodes 142 and 144. The via-insulation layer 146 may substantially serve as a planarization layer.

The display structure may be stacked on the via-insulation layer 146. In some embodiments, the display structure may include a first electrode 150, an organic light emitting layer 160 and a second electrode 170 sequentially stacked on the via-insulation layer 146.

The first electrode 150 may serve as a pixel electrode, and may be provided per each sub pixel. In some embodiment, the first electrode 150 may serve as an anode of the organic light emitting display panel 100. A pixel defining layer 155 may be disposed on the via-insulation layer 146, and may cover a peripheral portion of the first electrode 150. The organic light emitting layer 160 may be disposed on the pixel defining layer 155 and the first electrode 150. The organic light emitting layer 160 may be individually patterned for each of a red sub pixel, a green sub pixel, and a blue sub pixel to generate a different color of light in the each sub pixel.

The second electrode 170 may be disposed on the pixel defining layer 155 and the organic light emitting layer 160. In some embodiments, the second electrode 170 may serve as a common electrode provided on a plurality of the pixels. The second electrode 170 may face the first electrode 150 and may serve as a cathode electrode of the organic light emitting display panel 100.

The encapsulation layer 180 protecting the display structure may be disposed on the second electrode 170. The encapsulation layer 180 may include an inorganic material such as silicon nitride and/or a metal oxide, for example. In some embodiments, the encapsulation layer 180 may include a first inorganic layer 181 including the inorganic material, an organic layer 182 disposed on the first inorganic layer 181 for serving as a planarization layer, and a second inorganic layer 183 disposed on the organic layer 182 for serving as an encapsulation. The organic layer 182 may include an organic material such as polyimide, epoxy-based resin, acrylic-based resin, polyester, and/or the like. In some embodiments, the inorganic material of the first inorganic layer 181 may be different from the inorganic material of the second inorganic layer 183. For example, the first inorganic layer 181 may include the silicon oxide and the second inorganic layer 183 may include the silicon nitride.

In some embodiments, the encapsulation layer 180 is not limited thereto, and the encapsulation layer 180 may be replaced by a rigid glass substrate.

A lower alignment layer or a lower lens electrode may be directly disposed on the planarized encapsulation layer 180.

FIGS. 8A to 8E are cross-sectional views for explaining a method of manufacturing a light field display device according to example embodiments.

Referring to FIGS. 8A to 8E, the method of manufacturing the light field display device may include forming an organic light emitting display panel in which a lower substrate, a back plane structure, a first electrode, a organic light emitting layer, a second electrode, and an encapsulation layer covering the second electrode are sequentially stacked, forming a lower alignment layer on the encapsulation layer, patterning an upper lens electrode on a lower surface of an upper substrate, the upper lens electrode forming an electric field with the second electrode, forming an upper alignment layer on the lower surface of the upper substrate to cover the upper lens electrode, forming a liquid crystal layer on the lower alignment layer or the upper alignment layer to constitute a microlens array having a plurality of micro liquid crystal lenses, and attaching the upper substrate to the encapsulation layer so that the liquid crystal layer is between the lower alignment layer and the upper alignment.

Figure 8A:
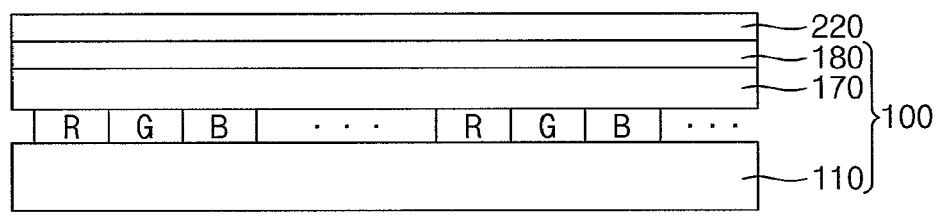
FIGS. 8A, 8B, 8C, 8D, and 8E are cross-sectional views for explaining a method of manufacturing a light field display device according to example embodiments.

As illustrated in FIGS. 7 and 8A, the organic light emitting display panel 100 in which the lower substrate 110, the back plane structure, the first electrode, the organic light emitting layer, the second electrode 170, and the encapsulation layer 180 covering the second electrode 170 are sequentially stacked may be formed. The back plane structure, the first electrode, and the organic light emitting layer may be included in each of a plurality of sub pixels R, G, and B. In some embodiments, the second electrode 170 may serve as a common electrode provided on a plurality of the sub pixels. The second electrode 170 may face the first electrode and may serve as a cathode electrode of the organic light emitting display panel 100. The encapsulation layer 180 may include a first inorganic layer, an organic layer for planarization, and a second inorganic layer that are sequentially stacked.

A lower alignment layer 220 may be formed on the encapsulation layer 180. In some embodiments, the lower alignment layer 220 may include a polyimide-based polymer resin. In some embodiments, the viscosity of the polyimide-based polymer resin may be about 1.7 cP (centi-poise) to about 3 cP. The lower alignment layer 220 may be directly formed on encapsulation layer 180 by a low-temperature firing process. In some embodiments, the polyimide-based polymer resin may be directly coated on the encapsulation layer 180 using a spin coating process, a bar coating process, or the like. Then, the coated polyimide-based polymer resin may be baked for about 1 minute in about 100° C. environment and then may be cured by ultraviolet rays having a wavelength about 300 nm to about 320 nm (preferably 313 nm) and an energy of about 20 mW/cm2, such that the lower alignment layer 220 may be formed. The lower alignment layer 220 may be directly formed on the encapsulation layer 180 of the organic light emitting display panel 100 in a relatively low temperature environment. Thus, deformation of the display structure caused by directly forming the lower alignment layer 220 on the encapsulation layer 180 may be prevented.

In some embodiments, a lower lens electrode including an indium-zinc oxide may be deposited on the encapsulation layer 180 before forming the lower alignment layer 220. Then, the polyimide-based polymer resin may be coated on the deposited lower lens electrode and exposed portions of the encapsulation layer 180 and the coated polyimide-based polymer resin may be baked in about 100° C. environment. Then, the baked polyimide-based polymer resin may be cured by the ultraviolet rays exposure to form the lower alignment layer 220. That is, the lower lens electrode driving the liquid crystal layer may be formed on the encapsulation layer 180.

Figure 8B:
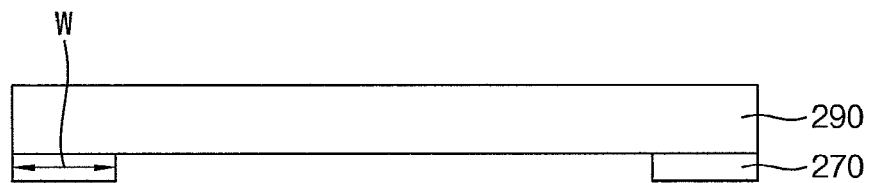

As illustrated in FIG. 8B, the upper lens electrode 270 may be patterned on the lower surface of the upper substrate 290. The upper lens electrode 270 may generate the electric field with the second electrode 170 in a stereoscopic image display mode. An arrangement of liquid crystal molecules may be controlled by the electric field. The upper lens electrode 270 may have annular patterns or honeycomb patterns surrounding each of the micro liquid crystal lenses. In some embodiments, the upper lens electrode 270 may have a plurality of openings. A planar shape of each of the openings may be substantially hexagonal, circular or elliptical.

In some embodiments, a width W of each of the patterns may be within a range of about 3% to about 20% of a pitch of each of the micro liquid crystal lenses.

The upper lens electrode 270 may include a transparent conductive material having a high work function. In some embodiments, the upper lens electrode 270 may be formed by patterning an indium tin oxide in a room temperature environment (about 20° C. to about 30° C.). However, this is an example, and the upper lens electrode 270 may include indium zinc oxide, zinc oxide or indium oxide, and the like.

Figure 8C:
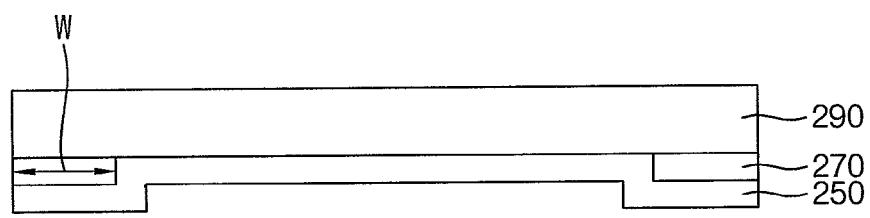

Then, as illustrated in FIG. 8C, the upper alignment layer 250 covering the upper lens electrode 270 may be formed on the lower surface of the upper substrate 290. The upper alignment layer 250 may have substantially the same material as the lower alignment 220. In some embodiments, the upper alignment layer 250 may be formed by substantially the same process as the lower alignment layer 220. For example, the upper alignment layer 250 may be also formed in the low temperature environment of about 100° C. environment.

Figure 8D:
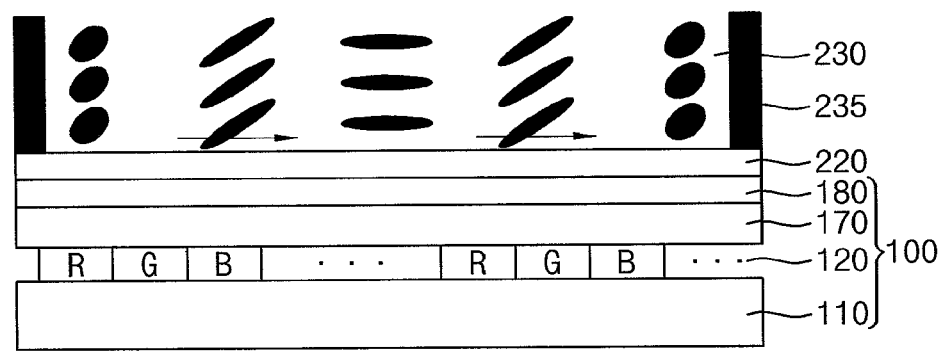

Then, as illustrated in FIG. 8D, the liquid crystal layer 230 may be formed on the lower alignment layer 220 to constitute a microlens array having a plurality of micro liquid crystal lenses ML. In some embodiments, sealants 235 may be formed on the lower alignment layer 220 and the liquid crystal may be injected or dropped between sealants 235.

Figure 8E:
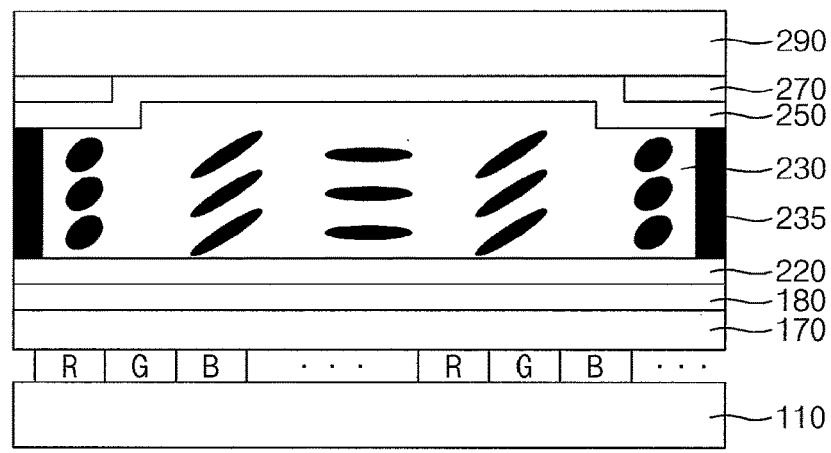

Then, as illustrated in FIG. 8E, the upper substrate 290 that the upper electrode 270 and the upper alignment layer 250 are formed may be attached to the encapsulation layer that the lower alignment layer 220 and the liquid crystal layer 230 are formed so that the liquid crystal layer 230 may be disposed between the lower alignment layer 220 and the upper alignment layer 250. For example, the sealants 235 may be cured by ultraviolet lays exposure so that the upper substrate 290 and the encapsulation layer may be attached.

As described above, the method of manufacturing the light field display device may form the lower alignment layer 220 in the relatively low temperature environment such that the liquid crystal lens structure including the micro lens array may be directly integrated on the organic light emitting display panel 100. Accordingly, an additional substrate and a lower electrode of the liquid crystal lens required for manufacturing the liquid crystal lens structure may be removed. Thus, the manufacturing cost of the light field display device may be reduced, and a thickness of the light field display device may be reduced. In addition, a flexible light field display device using a flexible organic light emitting display panel can be implemented.

Figure 9:
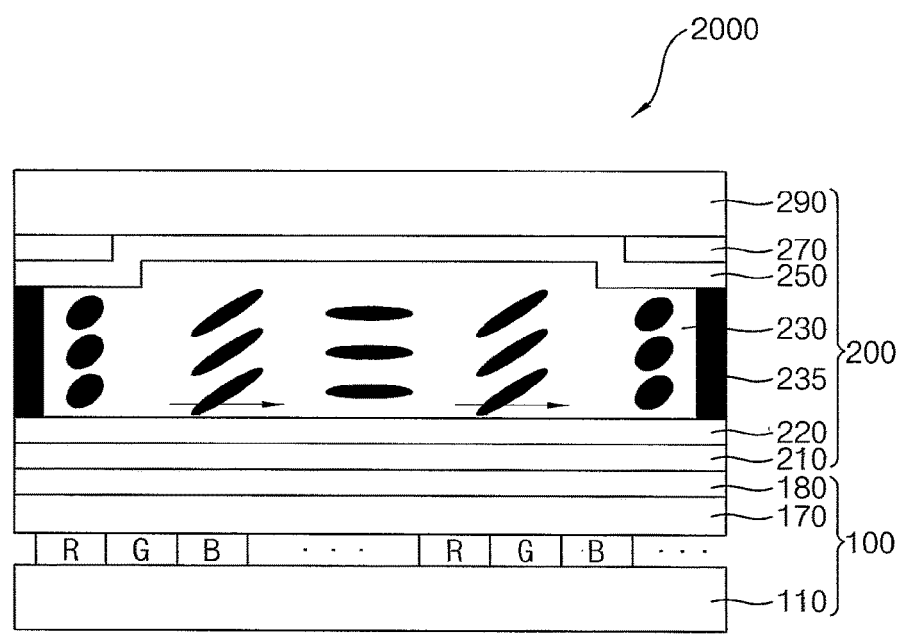
FIG. 9 is a cross-sectional view of a light field display device according to example embodiments.

FIG. 9 is a cross-sectional view of a light field display device according to example embodiments.

The light field display device of the present example embodiments is substantially the same as the light field display device explained with reference to FIGS. 2 to 7 except for a construction of a lower lens electrode and a lower alignment layer. Thus, the same reference numerals will be used to refer to the same or like parts as those described in the example embodiments of FIG. 2, and any repetitive explanation concerning the above elements will be omitted.

Referring to FIG. 9, the light field display device 2000 may include an organic light emitting display panel 100 having a lower substrate 110, an encapsulation layer 180, and a plurality of sub pixels R, G, B arranged in a matrix form between the lower substrate 110 and the encapsulation layer 180, a lower lens electrode 210, a lower alignment layer 220, a liquid crystal layer 230, an upper alignment layer 250, an upper lens electrode 270, and an upper substrate 290. In some embodiments, a polarizer for controlling a transmission axis direction of light may be further disposed on the upper substrate 290.

The light field display device 2000 may be divided into an organic light emitting display panel 100 and a microlens array 200 integrated on an emitting surface of the organic light emitting display panel 100.

Since the constructions of the organic light emitting display panel 100 are described above with reference to FIGS. 2 and 7, duplicated descriptions will not be repeated.

In a stereoscopic image display mode, the upper lens electrode 270 may function as an upper driving electrode of the liquid crystal layer 230. In the stereoscopic image display mode, the lower lens electrode 210 and/or the second electrode 170 (e.g., a cathode electrode of an organic light emitting diode) of the organic light emitting display panel 100 may function as a lower driving electrode to drive the liquid crystal layer 230. Thus, alignment directions of the liquid crystal molecules included in the liquid crystal layer 230 may be appropriately adjusted by an electric field formed between the upper lens electrode 270 and the lower lens electrode (or the second electrode 170).

The lower lens electrode 210 may be directly disposed on the encapsulation layer 180. In some embodiments, the lower lens electrode 210 may include indium zinc oxide. The lower lens electrode 210 may be directly deposited on the encapsulation layer 180 in a room temperature (about 20° C. to about 30° C.). In some embodiments, the lower lens electrode 210 may face the sub pixels R, G, and B. The lower lens electrode 210 may be disposed as a common electrode.

The lower alignment layer 220 may be disposed on the lower lens electrode 210 by a low-temperature firing process of a polyimide-based polymer resin. The lower alignment layer 220 may be formed in about 100° C. environment to prevent deformation of the organic light emitting display panel 100.

Since the lower lens electrode 210 and the lower alignment layer 220 may be formed in a relatively low temperature, the lower lens electrode 210 and the lower alignment layer 220 can be integrated on the heat sensitive organic light emitting display panel 100.

The liquid crystal layer 230 including a plurality of micro liquid crystal lenses for constituting the microlens array may be disposed on the lower alignment layer 220. In some embodiments, a planar shape of each of the micro liquid crystal lenses may have at least one of circular shape, elliptical shape, and hexagonal shape. The liquid crystal layer 230 may be formed by injecting or dropping the liquid crystal between the lower alignment layer 220 and the upper alignment layer 250.

The upper alignment layer 250 may be disposed between the liquid crystal layer 230 and the upper lens electrode 270. In some embodiments, the upper alignment layer 250 may include the polyimide-based polymer resin.

The upper lens electrode 270 may be disposed on the liquid crystal layer 230 and the upper alignment layer 250. The upper lens electrode 270 may generate the electric field with the second electrode 170 (and/or the lower lens electrode 210) in the stereoscopic image display mode. The upper lens electrode 270 may have annular patterns surrounding each of the micro liquid crystal lenses. In some embodiments, an outer shape of a planar shape of each of the annular patterns of the upper lens electrode 270 may be substantially hexagonal. In some embodiments, the outer shape of the planar shape of each of the annular patterns may be substantially tetragonal. In some embodiments, the outer shape of the planar shape of each of the annular patterns may be substantially circular. Since these are examples, shapes of the annular patterns are not limited thereto.

In some embodiments, a width W of each of the annular patterns may be within a range of about 3% to about 20% of a pitch of each of the micro liquid crystal lenses. Accordingly, unexpected refraction and diffraction of the light due to the arrangement of the upper lens electrode 270 can be prevented.

The upper substrate 290 may be disposed on the upper lens electrode 270.

In some embodiments, the light field display device 2000 may further include a touch sensing unit on the upper substrate 290.

As described above, the light field display device 2000 according to example embodiments may have the liquid crystal lens structure including the microlens array 200 directly integrated on the organic light emitting display panel 100, so that an additional substrate required for manufacturing a liquid crystal lens panel can be removed. Accordingly, the manufacturing cost of the light field display device 2000 may be reduced, and a thickness of the light field display device 2000 may be reduced. In addition, a flexible light field display device using a flexible organic light emitting display panel can be implemented.

Figure 10:
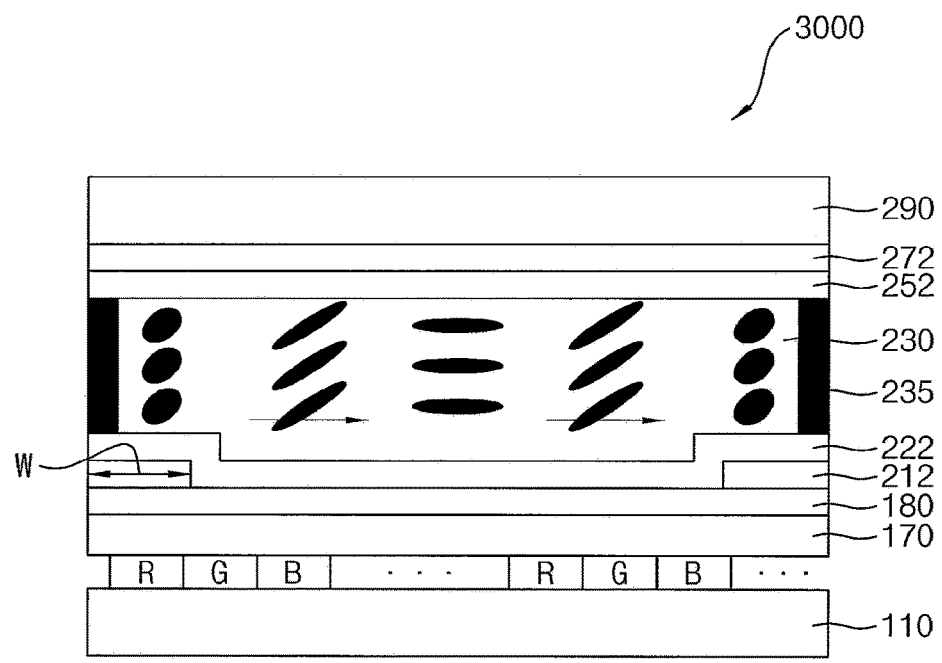
FIG. 10 is a cross-sectional view of a light field display device according to example embodiments.

FIG. 10 is a cross-sectional view of a light field display device according to example embodiments.

The light field display device of the present example embodiments is substantially the same as the light field display device explained with reference to FIGS. 2 to 7 except for constructions of a lower lens electrode and an upper lens electrode. Thus, the same reference numerals will be used to refer to the same or like parts as those described in the example embodiments of FIG. 2, and any repetitive explanation concerning the above elements will be omitted.

Referring to FIG. 10, the light field display device 3000 may include an organic light emitting display panel 100 having a lower substrate 110, an encapsulation layer 180, and a plurality of sub pixels R, G, B arranged in a matrix form between the lower substrate 110 and the encapsulation layer 180, a lower lens electrode 212, a lower alignment layer 222, a liquid crystal layer 230, an upper alignment layer 252, an upper lens electrode 272, and an upper substrate 290. In some embodiments, a polarizer for controlling a transmission axis direction of light may be further disposed on the upper substrate 290. In some embodiments, a touch sensing unit for recognizing touches may be further disposed on the upper substrate 290.

In a stereoscopic image display mode, the upper lens electrode 272 may function as an upper driving electrode of the liquid crystal layer 230. In the stereoscopic image display mode, the lower lens electrode 212 and/or the second electrode 170 (e.g., a cathode electrode of an organic light emitting diode) of the organic light emitting display panel 100 may function as a lower driving electrode to drive the liquid crystal layer 230.

The lower lens electrode 212 may be directly patterned on the encapsulation layer 180. In some embodiments, the lower lens electrode 212 may include indium zinc oxide. The lower lens electrode 212 may be directly deposited on the encapsulation layer 180 in a room temperature (about 20° C. to about 30° C.). In some embodiments, the lower lens electrode 212 may have annular patterns surrounding each micro liquid crystal lens. In some embodiments, an outer shape of a planar shape of each of the annular patterns of the lower lens electrode 212 may be substantially hexagonal. In some embodiments, the outer shape of the planar shape of each of the annular patterns may be substantially tetragonal. In some embodiments, the outer shape of the planar shape of each of the annular patterns may be substantially circular. Since these are examples, shapes of the annular patterns are not limited thereto.

The lower alignment layer 222 may be disposed on the encapsulation layer 180 covering the patterned lower lens electrode 212 by a low-temperature firing process of a polyimide-based polymer resin. The lower alignment layer 222 may be formed in about 100° C. environment to prevent deformation of the organic light emitting display panel 100.

The liquid crystal layer 230 including a plurality of micro liquid crystal lenses for constituting the microlens array may be disposed on the lower alignment layer 222.

The upper alignment layer 252 may be disposed between the liquid crystal layer 230 and the upper lens electrode 272.

In some embodiments, the upper alignment layer 252 may include the polyimide-based polymer resin.

The upper lens electrode 272 may be disposed on the upper alignment layer 252. The upper lens electrode 272 may generate the electric field with the second electrode 170 and/or the lower lens electrode 212 in the stereoscopic image display mode. In some embodiments, the upper lens electrode 272 may face the sub pixels R, G, and B. The upper lens electrode 272 may be disposed as a common electrode.

Accordingly, the light field display device 3000 according to example embodiments may have the liquid crystal lens structure including the microlens array 200 directly integrated on the organic light emitting display panel 100, so that an additional substrate required for manufacturing a liquid crystal lens panel can be removed.

Figure 11:
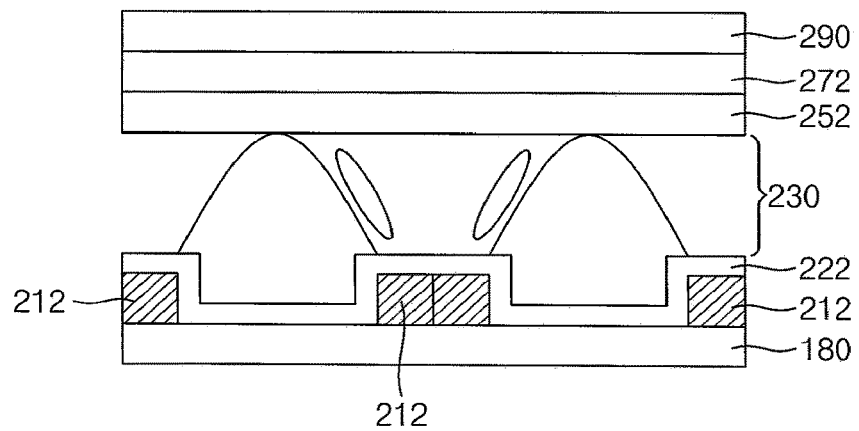
FIG. 11 is a cross-sectional view of an example of a microlens array included in the light field display device of FIG. 10.

FIG. 11 is a cross-sectional view of an example of a microlens array included in the light field display device of FIG. 10.

Referring to FIG. 11, the patterned lower lens electrode 212 may be disposed on the encapsulation layer 180 of the organic light emitting display panel and the lower alignment layer 222 covering the patterned lower lens electrode 212 may be also disposed on the encapsulation layer 180. The liquid crystal layer 230 having micro liquid crystal lenses may be disposed between the lower alignment layer 252 and the upper substrate 290 where the upper lens electrode 272 and the upper alignment layer 252 are formed.

In the stereoscopic image display mode, liquid crystal molecules may be rearranged by an electrical field between the lower lens electrode 212 having annular patterns and the upper lens electrode 272 having the common electrode pattern and the light field may be generated.

Figure 12A:
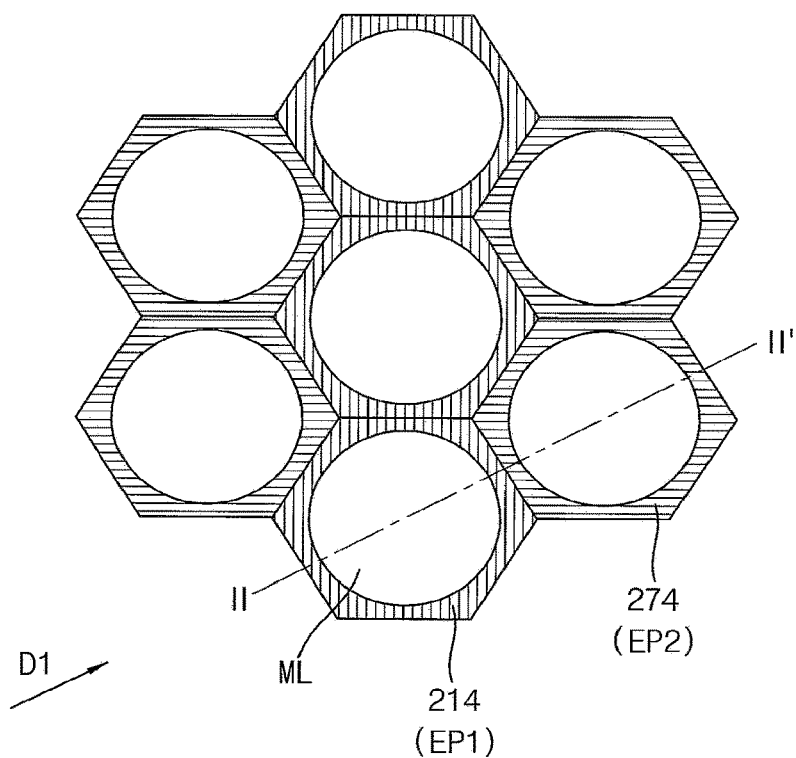
FIG. 12A is a plan view schematically illustrating an example of a microlens array, an upper lens electrode, and a lower lens electrode in the light field display device of FIG. 10.
Figure 12B:
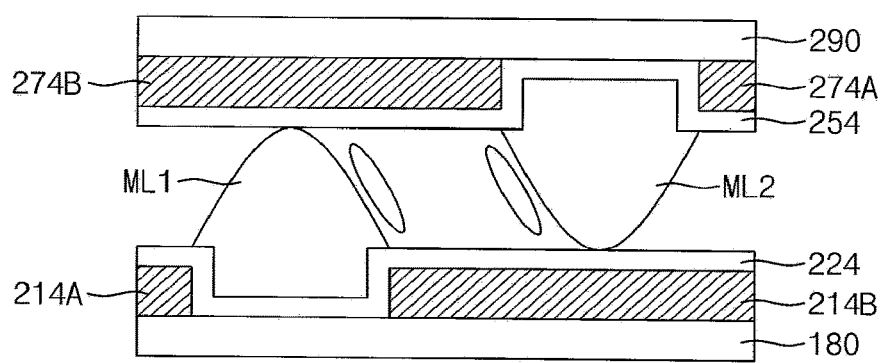
FIG. 12B is a cross-sectional view schematically illustrating an example of a portion taken along a line II-II' of FIG. 12A.

FIG. 12A is a plan view schematically illustrating an example of a microlens array, an upper lens electrode, and a lower lens electrode in the light field display device of FIG. 10. FIG. 12B is a cross-sectional view schematically illustrating an example of a portion taken along a line II-II' of FIG. 12A.

Referring to FIGS. 10, 12A, and 12B, the lower lens electrode 214 and the upper lens electrode 274 may have annular patterns EP1 and EP2 each surrounding different micro liquid crystal lenses.

In some embodiments, the lower lens electrode 214 and the upper lens electrode 274 may have annular patterns EP1 and EP2 alternating with each other in a first direction D1 in which the micro liquid crystal lenses ML are arranged. For example, one of the lower and upper lens electrodes 214 and 274 may be the annular pattern and the other may have a flat electrode portion for one micro liquid crystal lens ML.

As illustrated in FIG. 12B, the lower lens electrode 214 may have the annular pattern portion 214A (e.g., represented as EP1 in FIG. 12A) surrounding a first micro liquid crystal lens ML1 and may have the flat electrode portion 214B corresponding to a second micro liquid crystal lens ML2 adjacent to the first micro liquid crystal lens ML1 in the first direction D1. For example, the lower lens electrode 214 may have holes corresponding to some of the micro lenses in the first direction D1. In addition, the upper lens electrode 274 may have the annular pattern portion 274A (e.g., represented as EP2 in FIG. 12A) surrounding the second micro liquid crystal lens ML2 and may have the flat electrode portion 274B corresponding to the first micro liquid crystal lens ML1. For example, the upper lens electrode 274 may have holes corresponding to some of the micro lenses in the first direction D1. Each of the holes of the upper lens electrode 274 does not overlap the holes of the lower lens electrode 214.

In some embodiments, in the micro liquid crystal lenses which are adjacent to each other in the first direction D1 (e.g., the first and second micro liquid crystal lenses ML1 and ML2), a part of an edge of the flat electrode portion 214B of the lower lens electrode 214 may overlap a part of an edge of the flat electrode portion 274B of the upper lens electrode 274.

Accordingly, the upper and lower lens electrodes 274 and 214 forming the microlens array may be patterned at different positions corresponding to the positions of the micro liquid crystal lenses.

As described above, shapes of the micro liquid crystal lenses and the lens electrodes may be adjusted so that the multiple viewpoint stereoscopic images having a high resolution of 2000 PPI (pixels per inch) or more can be implemented.

The present embodiments may be applied to any display device applying the light filed display. For example, the present embodiments may be applied to a television, a computer monitor, a laptop, a digital camera, a cellular phone, a smart phone, a smart pad, a personal digital assistant (PDA), a portable multimedia player (PMP), a MP3 player, a navigation system, a game console, a video phone, a head up display system, a wearable display device, etc.

The foregoing is illustrative of example embodiments, and is not to be construed as limiting thereof. Although a few example embodiments have been described, those skilled in the art will readily appreciate that many modifications are possible in the example embodiments without materially departing from the novel teachings and advantages of example embodiments. Accordingly, all such modifications are intended to be included within the scope of example embodiments as defined in the claims. In the claims, means-plus-function clauses are intended to cover the structures described herein as performing the recited function and not only structural equivalents but also equivalent structures. Therefore, it is to be understood that the foregoing is illustrative of example embodiments and is not to be construed as limited to the specific embodiments disclosed, and that modifications to the disclosed example embodiments, as well as other example embodiments, are intended to be included within the scope of the appended claims. The inventive concept is defined by the following claims, with equivalents of the claims to be included therein.

What is claimed is:

1. A light field display device, comprising:
    a lower substrate;
    a back plane structure on the lower substrate; a first electrode electrically connected to the back plane structure; an organic light emitting layer on the first electrode;
    a second electrode facing the first electrode and covering the organic light emitting layer;
    an encapsulation layer covering the second electrode; a lower alignment layer directly on the encapsulation layer;
    a liquid crystal layer on the lower alignment layer, the liquid crystal layer including a plurality of micro liquid crystal lenses to constitute a microlens array;
    a lens electrode on the liquid crystal layer to form an electric field with the second electrode; and
    an upper substrate directly on the lens electrode.

2. The device of claim 1, wherein a voltage is applied to the lens electrode in a stereoscopic image display mode to form the electric field between the lens electrode and the second electrode.

3. The device of claim 1, further comprising:
an upper alignment layer between the liquid crystal layer and the lens electrode.

4. The device of claim 3, wherein the lens electrode has a plurality of annular patterns, and
wherein each of the micro liquid crystal lenses is surrounded by an annular pattern of the plurality of annular patterns.

5. The device of claim 4, wherein a planar shape of each of the micro liquid crystal lenses surrounded by the lens electrode is circular or elliptical.

6. The device of claim 4, wherein the lens electrode includes a plurality of circular or elliptical openings corresponding to the micro liquid crystal lenses.

7. The device of claim 4, wherein a planar shape of the lens electrode is a quadrilateral shape having a plurality of circular or elliptical openings corresponding to the micro liquid crystal lenses.

8. The device of claim 4, wherein the lens electrode has a plurality of hexagonal openings, and
wherein a planar shape of each of the micro liquid crystal lenses surrounded by the lens electrode is substantially hexagonal.

9. The device of claim 4, wherein a width of each of the annular patterns is within a range of about 3% to about 20% of a pitch of each of the micro liquid crystal lenses.

10. The device of claim 3, further comprising:
a touch sensing unit on the upper substrate.

11. A method of manufacturing a light field display device, comprising:
forming an organic light emitting display panel in which a lower substrate, a back plane structure, a first electrode, a organic light emitting layer, a second electrode, and an encapsulation layer covering the second electrode are sequentially stacked;
forming a lower alignment layer on the encapsulation layer;
patterning an upper lens electrode on a lower surface of an upper substrate, the upper lens electrode forming an electric field with the second electrode;
forming an upper alignment layer on the lower surface of the upper substrate to cover the upper lens electrode;
forming a liquid crystal layer on the lower alignment layer or the upper alignment layer to constitute a microlens array having a plurality of micro liquid crystal lenses; and
attaching the upper substrate to the encapsulation layer so that the liquid crystal layer is between the lower alignment layer and the upper alignment layer.

12. The method of claim 11, wherein forming the lower alignment layer includes:
directly coating a polyimide-based polymer resin on an upper surface of the encapsulation layer; and
baking the coated polyimide-based polymer resin in an about 100° C. environment, followed by ultraviolet curing.

13. The method of claim 11, wherein the upper lens electrode includes an indium zinc oxide patterned in a room temperature environment.

14. The method of claim 11, wherein the upper lens electrode has a plurality of annular patterns, and
wherein each of the micro liquid crystal lenses is surrounded by an annular pattern of the plurality of annular patterns.

15. The method of claim 14, wherein the upper lens electrode includes a plurality of circular or elliptical openings corresponding to the micro liquid crystal lenses.

16. The method of claim 11, wherein forming a lower alignment layer includes:
depositing a lower lens electrode including an indium zinc oxide on the encapsulation layer in a room temperature environment;
directly coating a polyimide-based polymer resin on an exposed portion of the encapsulation layer and the lower lens electrode; and
baking the coated polyimide-based polymer resin in an about 100° C. environment, followed by the ultraviolet curing.

* * * * *